(12) United States Patent
Kuroda

(10) Patent No.: US 7,528,875 B2
(45) Date of Patent: May 5, 2009

(54) SOLID STATE IMAGING APPARATUS AND METHOD FOR HANDLING READ REGION

(75) Inventor: Yukihiro Kuroda, Tokyo (JP)

(73) Assignee: Olympus Corporation, Tokyo (JP)

( * ) Notice: Subject to any disclaimer, the term of this patent is extended or adjusted under 35 U.S.C. 154(b) by 637 days.

(21) Appl. No.: 11/097,374

(22) Filed: Apr. 4, 2005

(65) Prior Publication Data

US 2005/0226022 A1    Oct. 13, 2005

(30) Foreign Application Priority Data

Apr. 6, 2004    (JP)    ............... 2004-112042

(51) Int. Cl.
*H04N 3/14* (2006.01)
(52) U.S. Cl. .................................... 348/302
(58) Field of Classification Search ............... 348/281, 348/302, 304, 303; 358/449; 377/81, 64
See application file for complete search history.

(56) References Cited

U.S. PATENT DOCUMENTS

| | | | | |
|---|---|---|---|---|
| 5,132,993 A | * | 7/1992 | Nishiura et al. | ............... 377/76 |
| 5,134,488 A | * | 7/1992 | Sauer | ............... 348/294 |
| 5,883,668 A | * | 3/1999 | Kazama et al. | ............... 348/303 |
| 5,909,247 A | * | 6/1999 | Hosokai et al. | ............... 348/302 |
| 6,937,277 B1 | * | 8/2005 | Hattori et al. | ............... 348/304 |
| 2005/0012837 A1 | * | 1/2005 | Gomi | ............... 348/303 |

FOREIGN PATENT DOCUMENTS

| | | | | |
|---|---|---|---|---|
| JP | 04277985 | A | * | 10/1992 |
| JP | 6-350933 | | | 12/1994 |
| JP | 06350933 | A | * | 12/1994 |

* cited by examiner

*Primary Examiner*—James M Hannett
*Assistant Examiner*—Gary C Vieaux
(74) *Attorney, Agent, or Firm*—Westerman, Hattori, Daniels & Adrian, LLP.

(57) ABSTRACT

A solid state imaging apparatus comprising: an imaging area comprising a plurality of pixels that are organized into a two-dimensional plane; a scanning circuit that reads a signal from a read region that is set in at least one of a horizontal direction and a vertical direction in the imaging area; and a control unit that sets the read region to the scanning circuit, and changes, when the read region is changed, a setting of the read region by comparing the read region before the change and the read region after the change.

17 Claims, 9 Drawing Sheets

SOLID STATE IMAGING APPARATUS AND METHOD FOR HANDLING READ REGION

BACKGROUND OF THE INVENTION

1. Field of the Invention

The present invention relates to a solid state imaging apparatus and to a method for handling a region to be read that permit a pixel in a desired region to be read.

Priority is claimed on Japanese Patent Application No. 2004-112042, filed Apr. 6, 2004, the content of which is incorporated herein by reference.

2. Description of Related Art

A conventional solid state imaging apparatus that permits a pixel in a desired region to be read is known. In such a solid state imaging apparatus, in order to allow only a desired region to be read, an electric potential storage portion is provided to each of the shift register unit portions that construct a horizontal scanning circuit and a vertical scanning circuit. An example of such a construction is shown in FIG. 17. In FIG. 17, reference numeral 1 denotes a shift register unit having a first clock-type inverter 1-1 and a second clock-type inverter 1-2 that are serially connected, reference numeral 2 denotes a storage portion having a first inverter 2-1 and a second inverter 2-2 that are serially connected, reference numeral 3 denotes a storage switch that conveys a level of the shift register unit 1 to the storage portion 2, and reference numeral 4 denotes a transfer switch that conveys information stored in the storage portion 2 to the shift register unit 1.

One terminal of the storage switch 3 is connected to an output of a first clock-type inverter 1-1 of the next stage shift register, and the other terminal is connected to an input of a first inverter 2-1 of the storage portion 2. One terminal of the transfer switch 4 is connected to an output of a first clock-type inverter 1-1, and the other terminal is connected to an input of a second inverter 2-2 of the storage portion 2. Reference numeral 5 represents a unit stage of the shift register. Although a 7-stage shift register is shown in FIG. 17, an actual solid state imaging apparatus has more numeral stages. It should be understood that the final stage has no storage portion 2.

The first clock-type inverter 1-1 is activated in response to a driving clock $\phi 2$ being set to an "H" level, and the second clock-type inverter 1-2 is activated in response to a clock $\phi 1$ being set to an "H" level. The first stage shift register unit 1 inputs a start pulse $\phi ST$. The storage switch 3 is turned on in response to a memory pulse $\phi M$ being set to an "H" level, and the transfer switch 4 is turned on in response to a transfer pulse $\phi T$ being set to an "H" level.

The operation of the shift register that has the above-described configuration will be described with reference to a timing chart shown in FIG. 18. First, in a pre-scanning that is executed prior to an actual scanning, the start pulse $\phi ST$ is set to an "H" level at the time $T_1$, and signals stored within the shift registers are shifted in response to clocks $\phi 1$ and $\phi 2$. At the time $T_2$, a memory pulse $\phi M$ is set to an "H" level, and each of the levels at nodes SR1.5, SR2.5, ..., and SR6.5 within each of the shift register units 1 is stored in a respective storage portion 2 at that time in response.

Since a storage portion 2 is connected to a shift register unit of the next stage, a level that is stored in the input of the storage portion 2 in each of the shift register stages is a "L" level except a storage portion 2 of the third stage shift register that stores an "H" level.

Next, at the time $T_3$, a transfer pulse $\phi T$ is set to an "H" level, and the respective level stored during the time $T_2$ is transferred to the nodes SR0.5, SR1.5, ..., and SR5.5 within each of the shift register unit 1 in response. Since the node SR6.5 in the last stage retains the previous level since no transfer switch 4 is connected to the node SR6.5 of the last stage. In this case, since the clock $\phi 1$ is set to an "H" level, inverted outputs in the nodes SR0.5, SR1.5, ..., and SR6.5 are output to the nodes SR1.0, SR2.0, ..., and SR7.0 in each of the shift register units 1. A shift operation is started according $\phi 1$ and $\phi 2$, and a scanning of the shift registers are started beginning from SR3.0.

Furthermore, when the memory pulse $\phi M$ is set to an "H" level at the time $T_4$, similar to the pre-scanning time period, each of the levels at nodes SR1.5, SR2.5, ..., and SR6.5 in each of the shift register unit 1 is stored in a respective storage portion 2, and accordingly the output of each of the storage portions 2 stores the same level as that at the time $T_2$. At the time $T_5$, in response to the transfer pulse $\phi T$ being set to an "H" level, information stored in the storage portions 2 is transferred so that scanning of the shift registers is started beginning at SR3.0, as at the time $T_3$. Again, a storing operation of the scanning start position is started at the time $T_6$.

Thus, in the actual scanning time period starting from the time $T_3$, scanning of the shift registers is started from the node SR3.0 by transferring the information stored in the storage portion 2. The starting position of the actual scanning can be changed by changing the timing to set the signal $\phi M$ to high, thus, a desired region can be read.

However, the above-identified technique does not specify any driving method or means to change a region to be read during a read operation of the solid-state image sensing device. Furthermore, in the above-identified technique, since a pre-scanning is required for reading a desired region, picture signals may be interrupted if a read region is changed while the solid-state image sensing device is executing a read operation.

SUMMARY OF THE INVENTION

The present invention was conceived in view of the above-identified problems, and an object thereof is to provide a solid state imaging apparatus and a method for handling a region to be read in which no picture signal is interrupted even when the read region is changed while the solid-state image sensing device is executing a read operation.

In order to solve the above-described problems, a first aspect of the present invention provides a solid state imaging apparatus including: an imaging area including a plurality of pixels that are organized into a two-dimensional plane; a scanning circuit that reads a signal from a read region that is set in at least one of a horizontal direction and a vertical direction in the imaging area; and a control unit that sets the read region to the scanning circuit, and changes, when the read region is changed, a setting of the read region by comparing the read region before the change and the read region after the change.

A second aspect of the present invention is a method for handling a read region in a solid state imaging apparatus comprising: an imaging area comprising a plurality of pixels that are organized into a two-dimensional plane; and a scanning circuit that reads a signal from a read region that is set in at least one of a horizontal direction and a vertical direction in the imaging area, comprising the steps of: detecting a change in a read region; and changing the read region by comparing the read region before the change and the read region after the change.

In the solid state imaging apparatus according to the first aspect of the present invention, the scanning circuit may include: a shift register including a plurality of shift register units, each of the shift register units defining a stage, each of the shift register units conveying information that is input, to a shift register unit of a next stage in response to a clock; a storage portion that stores information stored in the shift register; a first transfer unit that transfers information stored in the shift register to the storage portion; and a second transfer unit that transfers information stored in the storage portion to the shift register.

In the solid state imaging apparatus according to the first aspect of the present invention, the control unit may execute: the pre-scanning that is executed on the scanning start position of the read region after the change prior to the actual scanning for reading a signal from the imaging area, causes the first transfer unit to store information that has been transferred to the shift register into the storage portion corresponding to the read region and the actual scanning causes the second transfer unit to store information that has been stored in the storage portion during the pre-scanning to the shift register unit.

In the solid state imaging apparatus according to the first aspect of the present invention, the control unit may control to execute the pre-scanning after the actual scanning is completed when one end of the read region after the change is positioned in front of the read region before the change in a direction to execute the read operation.

In the solid state imaging apparatus according to the first aspect of the present invention, the control unit may control to execute the pre-scanning in the actual scanning when one end of the read region after the change is included in the read region before the change.

In the solid state imaging apparatus according to the first aspect of the present invention, the control unit may control to execute the pre-scanning in the actual scanning by continuing the actual scanning when one end of the read region after the change is positioned behind the read region before the change.

The method for handling a read region according to the second aspect of the present invention may include the step of controlling to execute the pre-scanning after the actual scanning is completed when one end of the read region after the change is positioned in front of the read region before the change in a direction to execute the read operation.

The method for handling a read region according to the second aspect of the present invention may include the step of controlling to execute the pre-scanning in the actual scanning when one end of the read region after the change is included in the read region before the change.

The method for handling a read region according to the second aspect of the present invention may include the step of controlling to execute the pre-scanning in the actual scanning by continuing the actual scanning when one end of the read region after the change is positioned behind the read region before the change.

DETAILED DESCRIPTION OF THE INVENTION

In the following, a solid state imaging apparatus according to various embodiments of the present invention will be described with reference to FIGS. 1 to 16.

Figure 1:
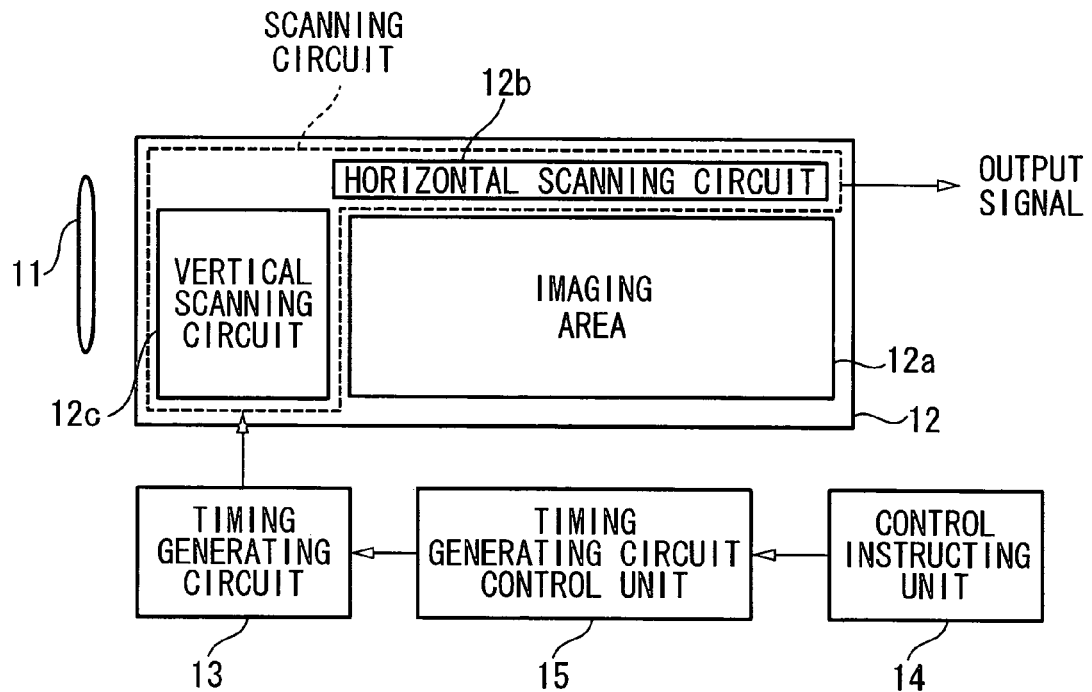
FIG. 1 is a schematic diagram of a solid state imaging apparatus according to an embodiment.

FIG. 1 is a schematic diagram of a solid state imaging apparatus according to an embodiment of the present invention. This solid state imaging apparatus includes an imaging lens 11, an imaging area 12a having a plurality of pixels, a solid-state image sensing device 12, a timing generating circuit 13, a control instructing unit 14, and a timing generating circuit control unit 15. The imaging lens 11 constitutes a part of the photographic optical system that transmits light beams from a subject to form an image of the object and to focus on a predetermined imaging area. The solid-state image sensing device 12 receives the image of the subject that transmits the imaging lens 11 and is focused on the imaging area, converts the optical signal to an electric signal, and outputs the resultant electric signal using a scanning circuit having a horizontal scanning circuit 12b and vertical scanning circuit 12c. The timing generating circuit 13 generates a timing to drive the solid-state image sensing device 12. The control instructing unit 14 is connected to various operating members (not shown), and generates an instruction signal related to a read region in response to an operation on the solid-state image sensing device 12. The timing generating circuit control unit 15 switches the timing generated by the timing generating circuit 13 in response to the instruction signal from the control instructing unit 14.

As the solid-state image sensing device 12, an X/Y-addressing solid-state image sensing device, such as a MOS solid-state image sensing device, may be used. Furthermore, the solid-state image sensing device 12 may read a desired region in the imaging area utilizing a technique, such as the method disclosed in Japanese Unexamined Patent Application, First Publication No. H06-350933. The control instructing unit 14 is connected to the operating members, and information on a selected read region as an instruction signal.

The term "information on a selected read region" refers to selecting a scanning start position and a scanning end position that define the selected region and are required by the horizontal scanning circuit 12b and the vertical scanning circuit 12c. Furthermore, as the operating member, a cross-cursor switch that enables a user to select a read region while visually viewing the actual region in a display apparatus may be used, for example.

The timing generating circuit control unit 15 is configured to receive an instruction signal from the control instructing unit 14, to compare a scanning start position of the scan range of the region for the current read operation with that of a newly selected region, and to switch the patterns of timing to set the scanning start position according to the result of the comparison.

Figure 2:
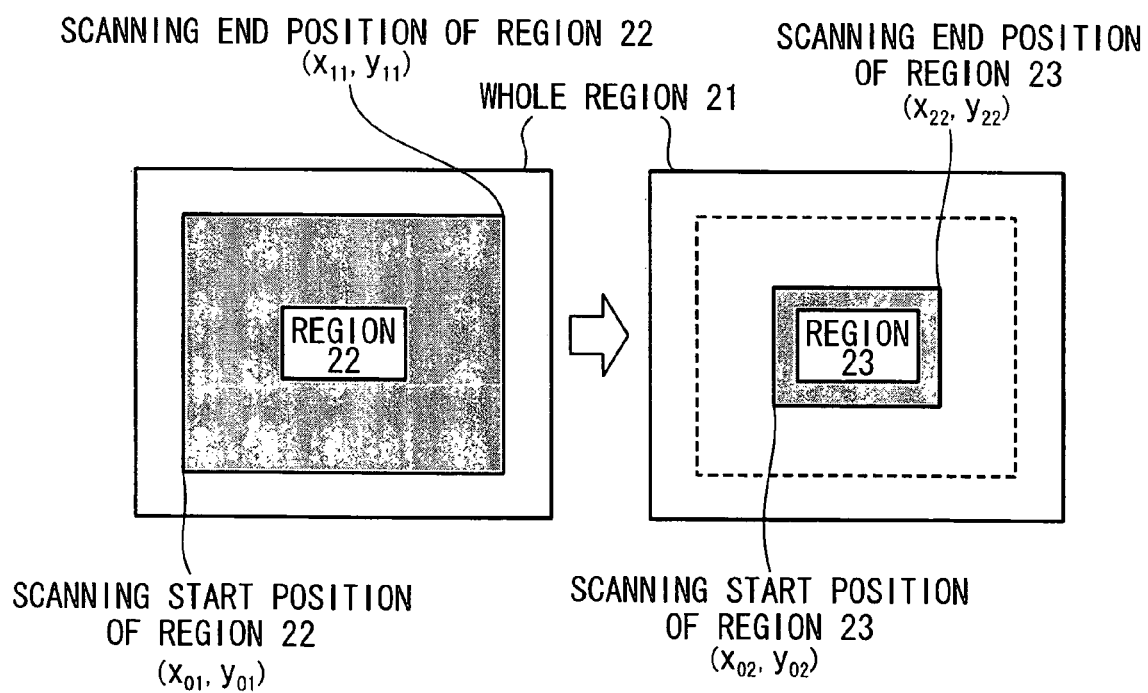
FIG. 2 illustrates a read region before and after the read region is changed.

The term "changing a read region" refers to changing the region upon which a read operation is executed from a region 22 that is currently selected as a read region in the entire region 21 of the pixels to a newly selected region 23 in FIG. 2. Furthermore, in this example, upon scanning the pixels, the horizontal scanning circuit 12b scans pixels in the x-direction, and the vertical scanning circuit 12c scans pixels in the y-direction from the lower left corner. The coordinate of the scanning start position of the region 22 is $(x_{01}, y_{01})$, and the coordinate of the scanning end position is $(x_{11}, y_{11})$, and the coordinate of the scanning start position of the region 23 is $(x_{02}, y_{02})$ and the coordinate of the scanning end position is $(x_{22}, y_{22})$.

In this case, when the timing generating circuit control unit 15 receives an instruction signal having such coordinates from the control instructing unit 14, the timing generating circuit control unit 15 compares the scanning start position of the region 23 with the scan range of the region 22 using this signal, and determines which one of the following cases is applied for setting the scanning start positions of the horizontal scanning circuit 12b and the vertical scanning circuit 12c.

Horizontal Scanning Circuit:
If $x_{02} < x_{01}$, then Case a
If $x_{01} \leq x_{02} \leq x_{22}$, then Case b
If $x_{02} > x_{11}$, then Case c Vertical Scanning Circuit:
If $y_{02} < y_{01}$, then Case A
If $y_{01} \leq y_{02} \leq y_{22}$, then Case B
If $y_{02} > y_{11}$, then Case C Accordingly, there are nine cases by a combination of Cases a, b, and c, and Cases A, B, and C of switching the timing executed by the timing generating circuit unit control unit 15.

Figure 17:
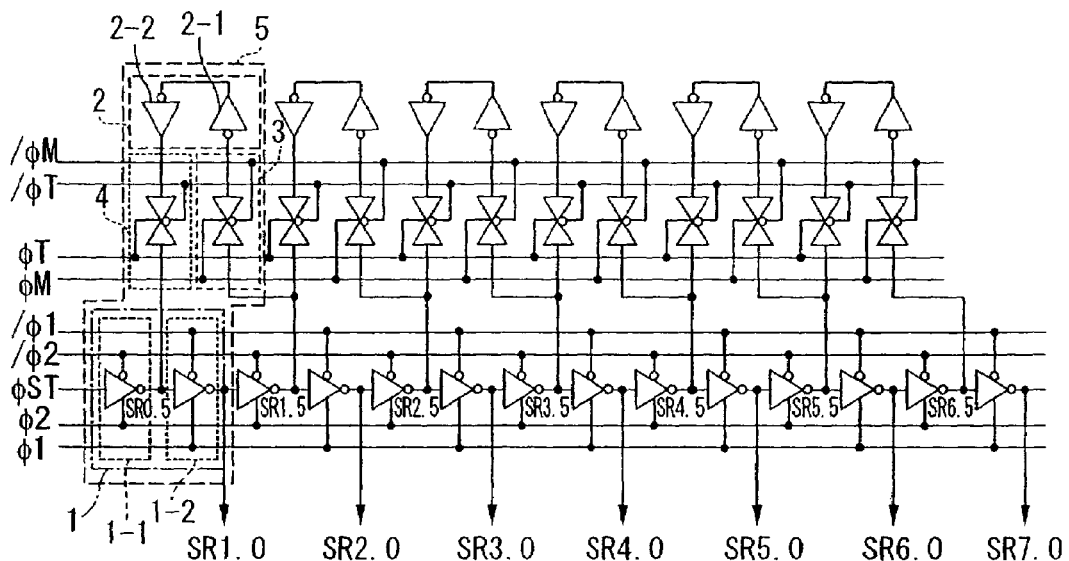
FIG. 17 is a schematic diagram of a conventional solid state imaging apparatus.
Figure 18:
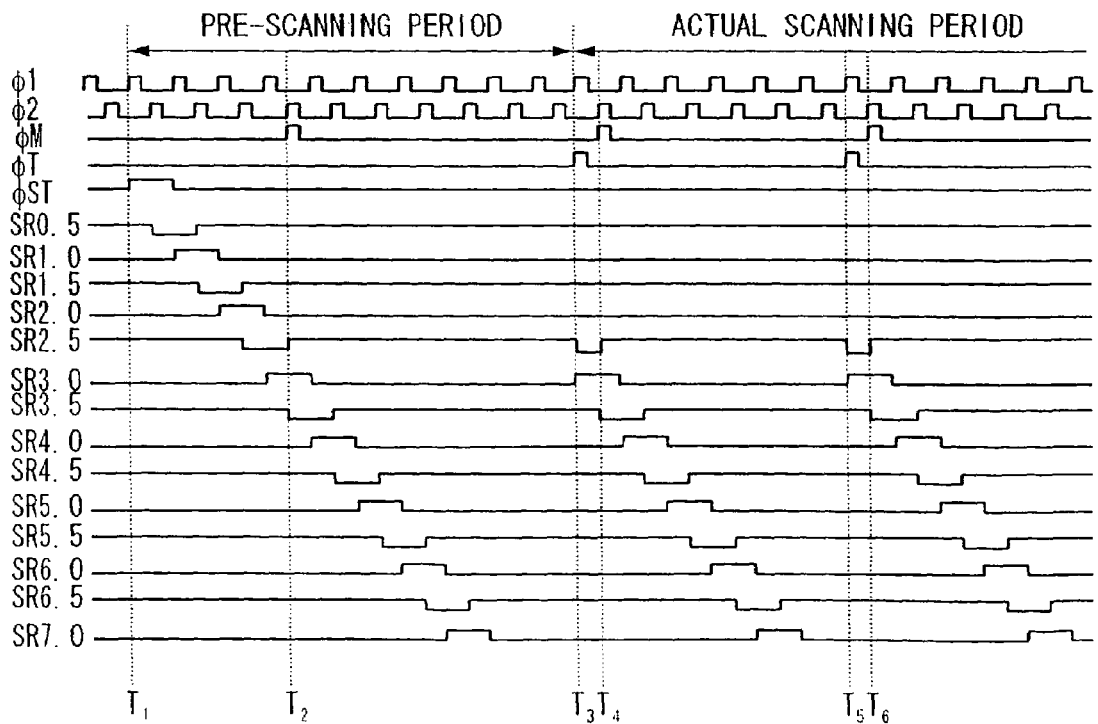
FIG. 18 is a timing chart of a conventional solid state imaging apparatus.

Next, the scan timing to set the scanning start positions of the horizontal scanning circuit 12b and the vertical scanning circuit 12c for each of the above-described nine cases will be described with reference to FIGS. 3 to 8. It should be understood that the timing charts of FIGS. 3 to 8 are for those of the configuration shown in FIG. 17, and the general operations of each elements are the same as the above description. In addition, for simplicity of illustration, signals corresponding to the clock φ1 and the start pulse φST in FIG. 18 are omitted.

First, scan timings of Cases A, B, and C for setting the scanning start position of the vertical scanning circuit 12c will be explained with reference to FIGS. 3 to 5 and FIGS. 9 to 12.

Figure 3:
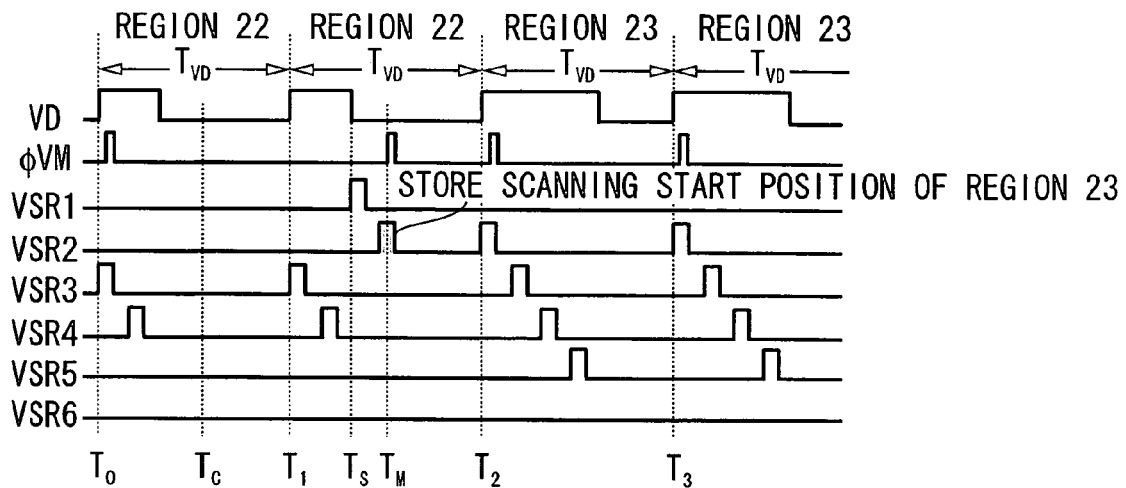
FIG. 3 is a timing chart of a vertical scanning circuit according to this embodiment.
Figure 9:
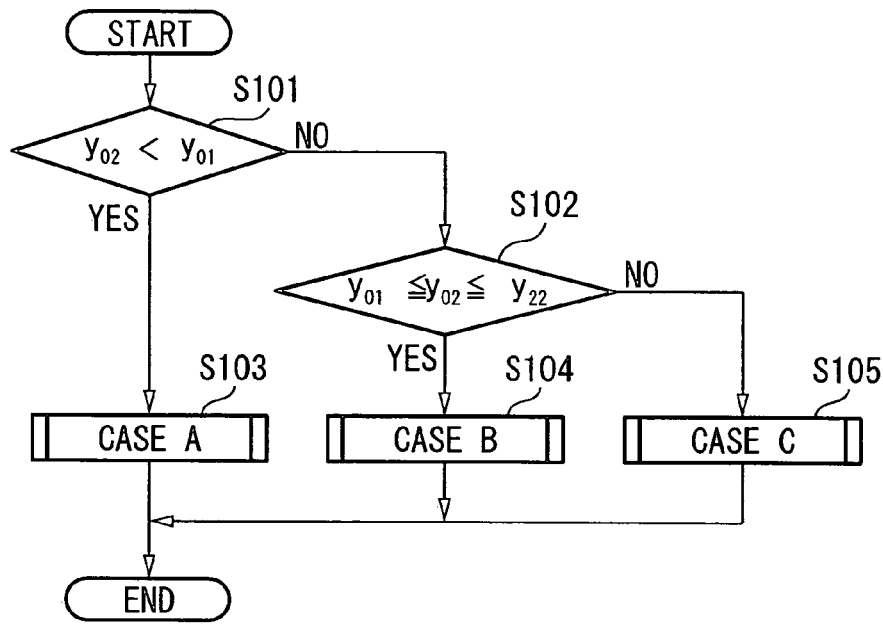
FIG. 9 is a flowchart of a process for setting a vertical scanning start position according to this embodiment.
Figure 10:
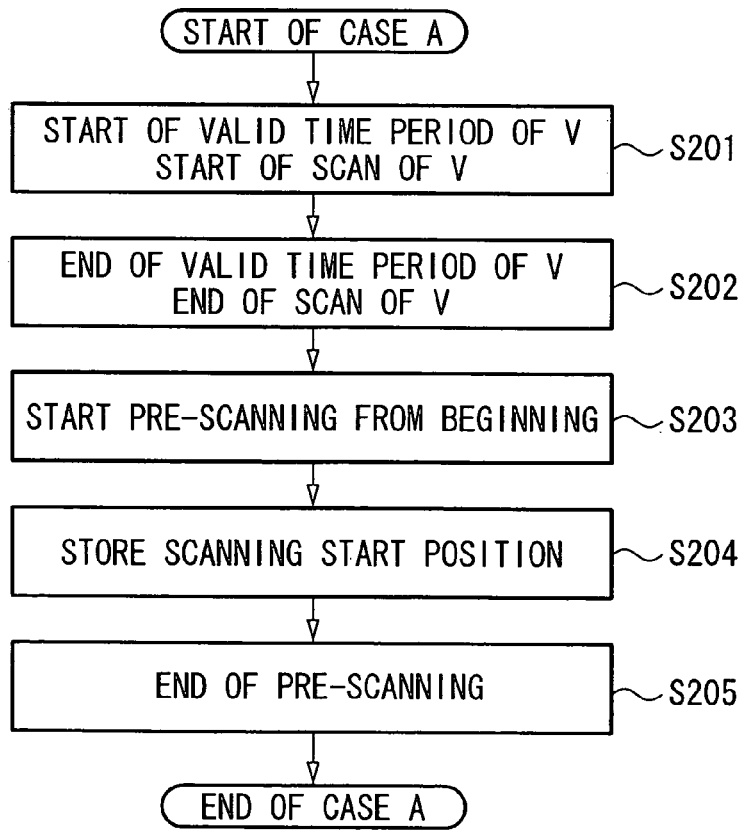
FIG. 10 is a flowchart of Case A in shown FIG. 9.

FIG. 3 is a timing chart for setting the scanning start position of the vertical scanning circuit 12c when the read region is changed from the region 22 to the region 23, which corresponds to the above-described Case A. FIGS. 9 and 10 are flowcharts showing operational flows in such a case. In other words, $y_{02} < y_{01}$ is satisfied between the scan range of the region 22 and the scanning start position of the region 23 in this case (Steps 101 and 103). The signal VD in FIG. 3 is a vertical synchronizing signal, and when VD is set to an "H" level, an output of the picture signal is enabled. The "$T_{VD}$" represents one cycle of the vertical synchronizing signal time period.

The signal φVM is a memory pulse to store the scanning start position of the vertical scanning circuit 12c, and when φVM is set to an "H" level, a storing operation is executed. Furthermore, the signals VSR1 to VSR6 are output from each of the shift register units constructing the vertical scanning circuit 12c. In the example shown in FIG. 3, the row range of pixels to be read in the region 22 is the third to the fourth rows, and the row range of the region 23 is the second to the fifth rows.

The vertical scanning circuit 12c starts a read operation of the region 22 at the time $T_0$, and the scan is completed at the time $T_1$. The instruction signal of the read region corresponding to the region 23 is generated by the control instructing unit 14 at the time $T_C$, and a read operation of the region 22 is again started at the time $T_1$ (Step 201). At this time, a storing operation of the scanning start position is not executed. After the read operation that was started at the time $T_1$ is completed (Step 202), scanning is started beginning from the first row at time $T_S$ (Step 203) and the scanning start position of the region 23 is stored at the time $T_M$ (Step 204). By the operations described above, a read operation corresponding to the region 23 is executed after the time $T_2$ (Step 205).

Figure 4:
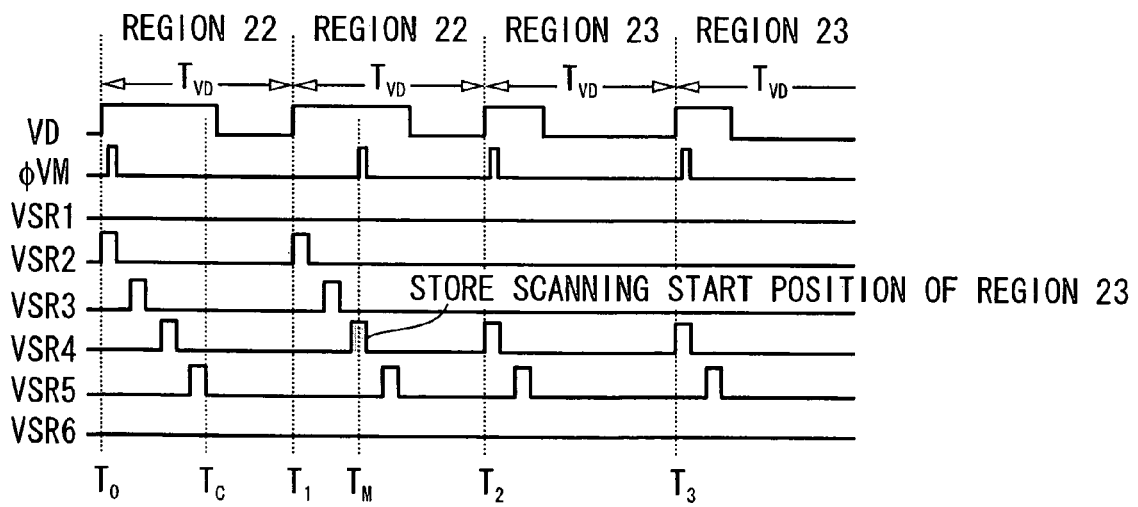
FIG. 4 is a timing chart of a vertical scanning circuit according to this embodiment.
Figure 11:
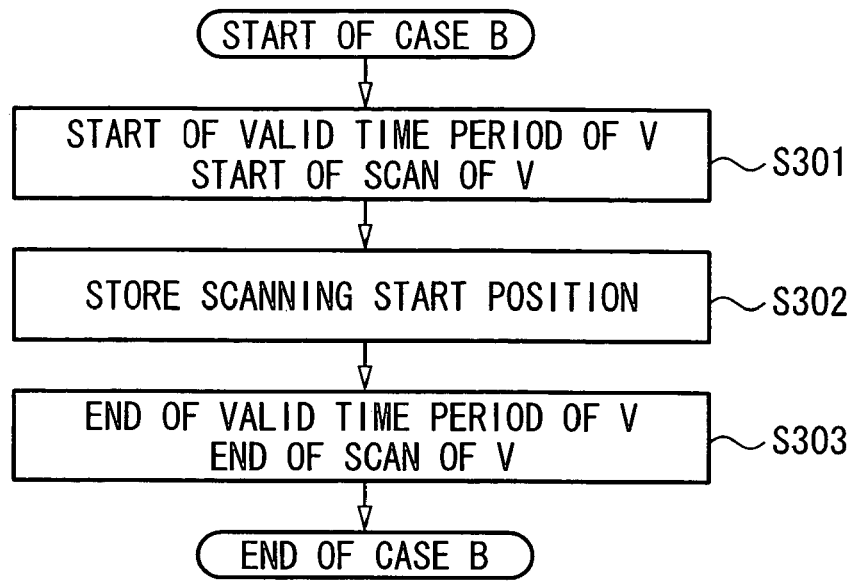
FIG. 11 is a flowchart of Case B in shown FIG. 9.

FIG. 4 is a timing chart for setting the scanning start position of the vertical scanning circuit 12c when the read region is changed from the region 22 to the region 23, which corresponds to the above-described Case B. FIGS. 9 and 11 are flowcharts showing operational flows in such a case. In this case, for example, the row range of pixels to be read in the region 22 is the second to the fifth rows, and the row range of the region 23 is the fourth to the fifth rows. In other words, $y_{01} \leq y_{02} \leq y_{22}$ is satisfied between the scan range of the region 22 and the scanning start position of the region 23 in this case (Steps 101, 102, and 104).

The vertical scanning circuit 12c starts a read operation of the region 22 at the time $T_0$. The instruction signal of the read region corresponding to the region 23 is generated by the control instructing unit 14 at the time $T_C$, and a read operation of the region 22 is again started at the time $T_1$ (Step 301). At this time, a storing operation of the scanning start position of the region 22 is not executed. Next, the scanning start position of the region 23 is stored at the time $T_M$ (Step 302). By the operations described above, a read operation corresponding to the region 23 is executed after the time $T_2$ (Step 303). Thus, in Case B, the read operation of the region 22 serves as the storing operation of the scanning start position of the region 23.

Figure 5:
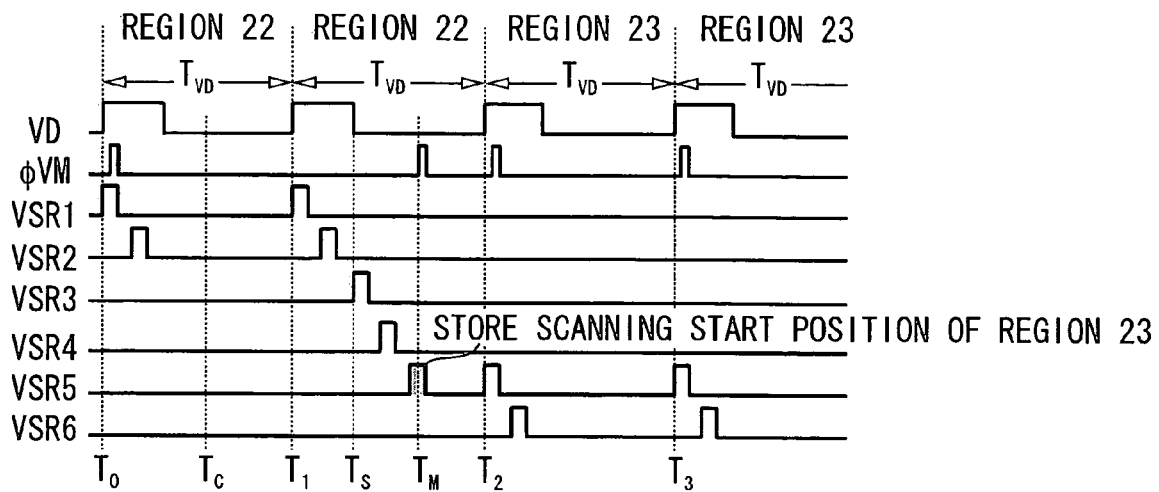
FIG. 5 is a timing chart of a vertical scanning circuit according to this embodiment.
Figure 12:
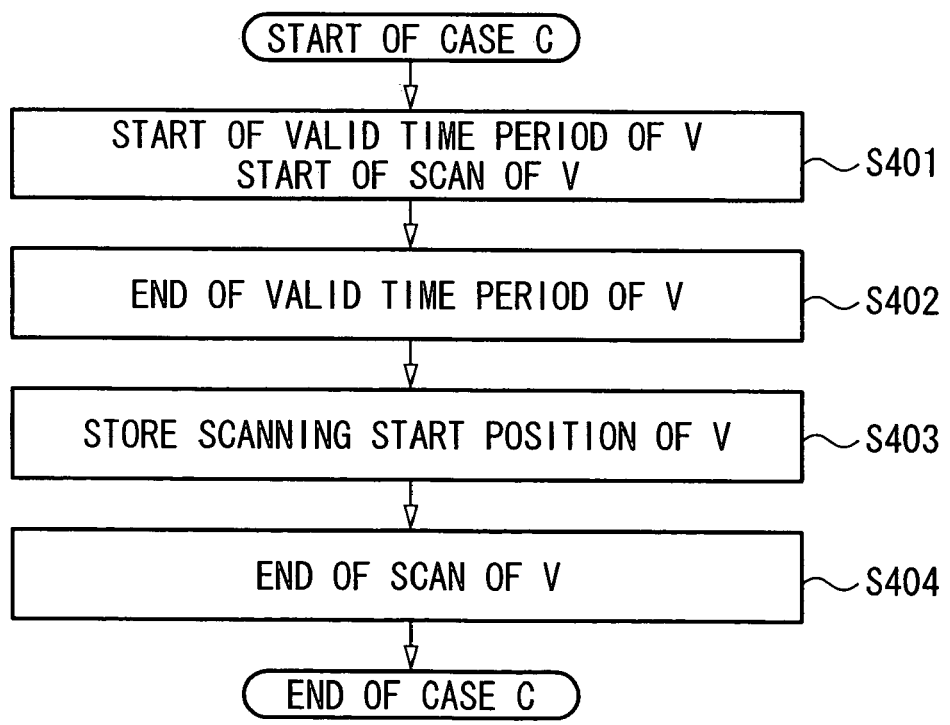
FIG. 12 is a flowchart of Case C in shown FIG. 9.

FIG. 5 is a timing chart for setting the scanning start position of the vertical scanning circuit 12c when the read region is changed from the region 22 to the region 23, which corresponds to the above-described Case C. FIGS. 9 and 12 are flowcharts showing operational flows in such a case. In this case, for example, the row range of pixels to be read in the region 22 is the first to the second rows, and the row range of the region 23 is the fifth to the sixth rows. In other words, $y_{02} > y_{11}$ is satisfied between the scan range of the region 22 and the scanning start position of the region 23 in this case (Steps 101, 102 and 105).

The vertical scanning circuit 12c starts a read operation of the region 22 at the time $T_0$. The instruction signal of the read region corresponding to the region 23 is generated by the control instructing unit 14 at the time $T_C$, and a read operation of the region 22 is again started at the time $T_1$ (Step 401). At this time, a storing operation of the scanning start position of the region 22 is not executed. After the read operation of the region 22 is completed (step 402), an operation on the shift registers of the vertical scanning circuit 12c is continued from the time $T_S$. Then, the scanning start position of the region 23 is stored at the time $T_M$ (Step 403). By the operations described above, a read operation corresponding to the region 23 is executed after the time $T_2$ (Step 404). Thus, in Case C, a part of the read operation of the region 22 serves as the storing operation of the scanning start position of the region 23.

Next, the scan timing to set the scanning start position of the horizontal scanning circuit 12b for Cases a, b, and c will be described with reference to FIGS. 6 to 8 and FIGS. 13 to 16. It is assumed that an instruction signal of the read region corresponding to the region 23 is generated by the control instructing unit 14 at the time $T_C$. In this case, considering the above-described cases for setting the scanning start position of the vertical scanning, at least one read operation of the region 22 is required to be executed after the time $T_C$. In the following description, the region 22 read after the time $T_C$ will be referred to as a next frame.

Figure 6:
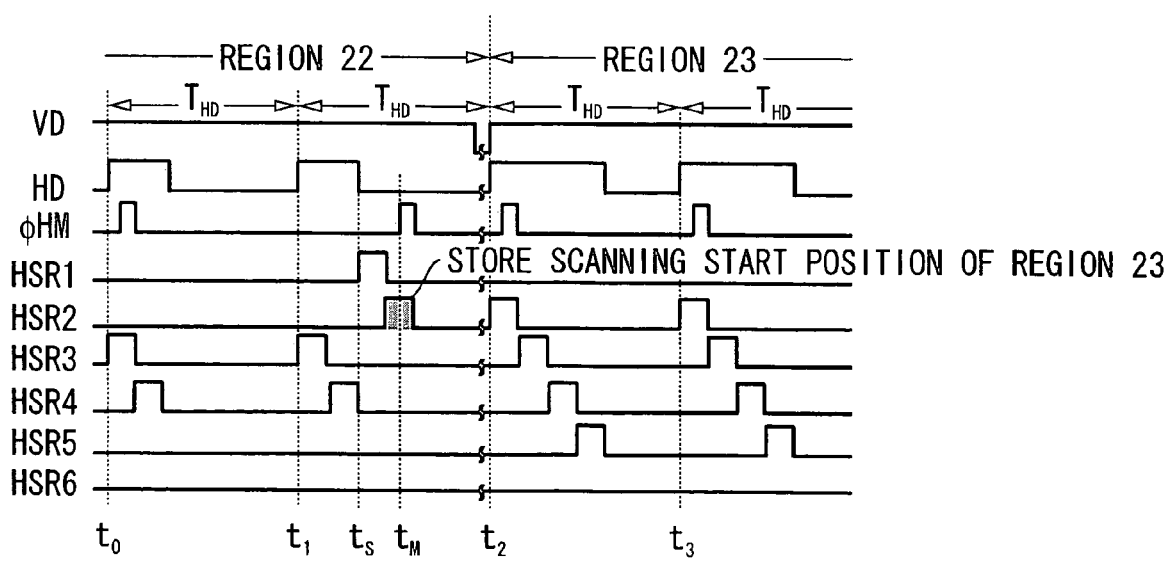
FIG. 6 is a timing chart of a horizontal scanning circuit according to this embodiment.
Figure 13:
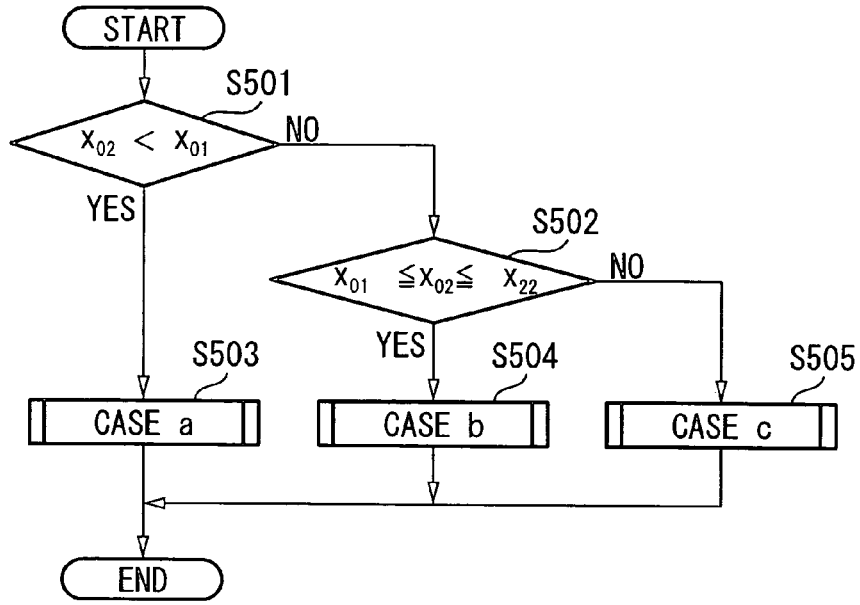
FIG. 13 is a flowchart of a process for setting a horizontal scanning start position according to this embodiment.
Figure 14:
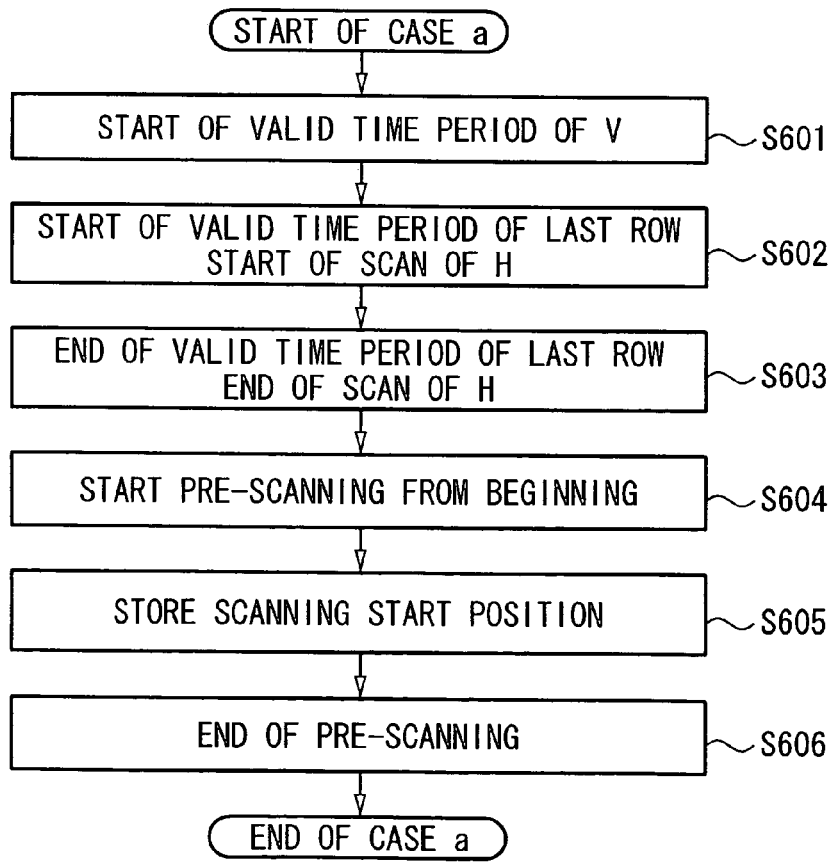
FIG. 14 is a flowchart of Case a in shown FIG. 13.

FIG. 6 is a timing chart for setting the scanning start position of the horizontal scanning circuit 12b when the read region is changed from the region 22 to the region 23, which corresponds to the above-described Case a. FIGS. 13 and 14 are flowcharts showing operational flows in such a case. In other words, $x_{02} < x_{01}$ is satisfied between the scan range of the region 22 and the scanning start position of the region 23 in this case (Steps 501 and 503). The signal VD in FIG. 6 is a vertical synchronizing signal, and when VD is set to an "H" level, an output of the picture signal is enabled. Furthermore, the signal HD is a horizontal synchronizing signal, and when HD is set to an "H" level, an output of the picture signal is enabled. The "$T_{HD}$" represents one cycle of the horizontal synchronizing signal time period.

The signal φHM is a memory pulse to store the scanning start position of the horizontal scanning circuit 12b, and when φHM is set to an "H" level, a storing operation is executed. Furthermore, the signals HSR1 to HSR6 are output from each of the shift register units that constitutes the horizontal scanning circuit 12b. In the example shown in FIG. 6, the column range of pixels to be read in the region 22 is the third to the fourth columns, and the column range of the region 23 is the second to the fifth columns.

The instruction signal of the read region corresponding to the region 23 is generated by the control instructing unit 14 at the time $t_C$ (not shown), and a read operation of the region 22 is executed until the last row of the next frame is reached, i.e., until the time $t_1$ in FIG. 6 (Step 601). A read operation of the region 22 is again executed from the time $t_1$ (Step 602). At this time, a storing operation of the scanning start position is not executed. After the read operation that was started at the time $t_1$ is completed (Step 603), scanning is started beginning from the first column at the time $t_S$ (Step 604) and the scanning start position of the region 23 is stored at the time $t_M$ (Step 605). By the operations described above, a read operation corresponding to the region 23 is executed after the time $t_2$ (Step 606).

Figure 7:
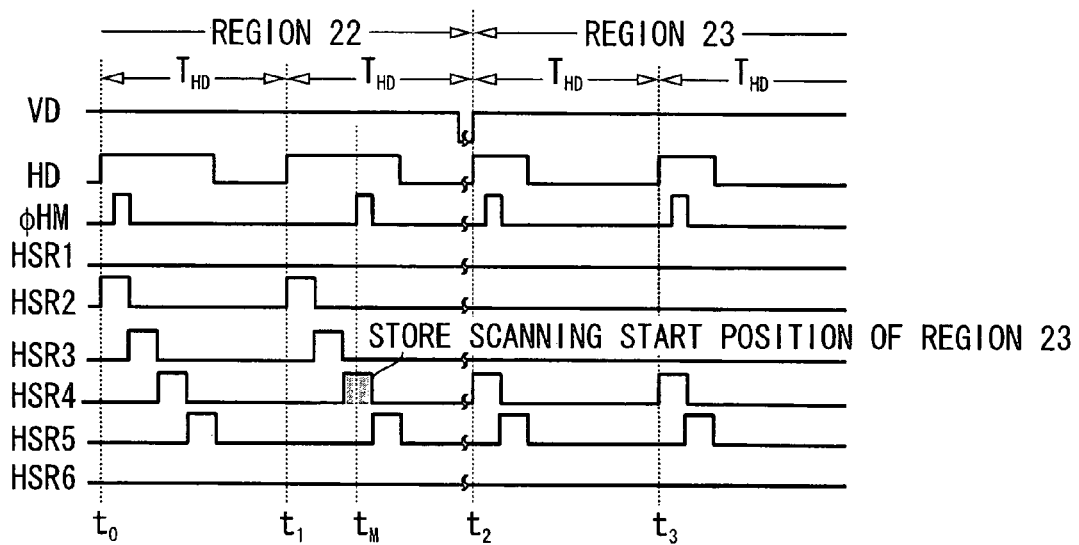
FIG. 7 is a timing chart of a horizontal scanning circuit according to this embodiment.
Figure 15:
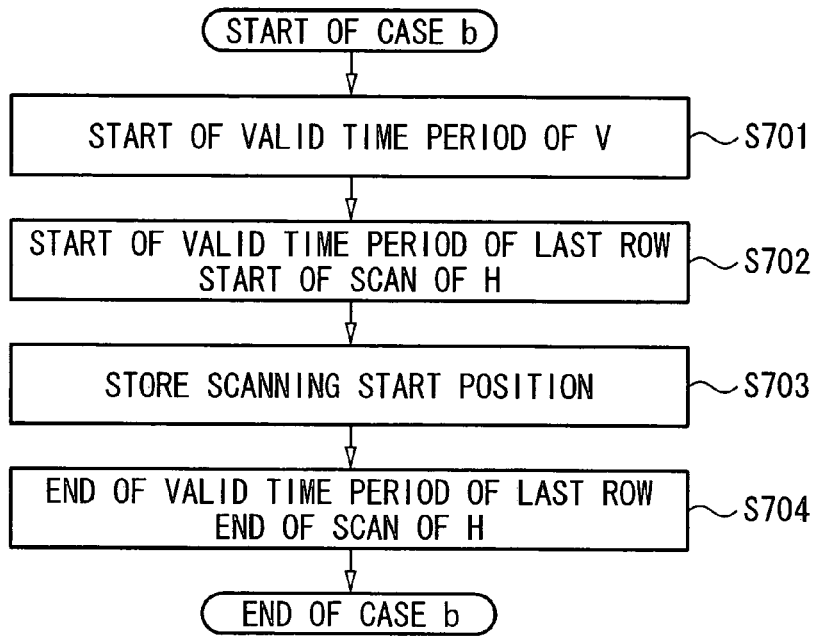
FIG. 15 is a flowchart of Case b in shown FIG. 13.

FIG. 7 is a timing chart for setting the scanning start position of the horizontal scanning circuit 12b when the read region is changed from the region 22 to the region 23, which corresponds to the above-described Case b. FIGS. 13 and 15 are flowcharts showing operational flows in such a case. In this case, for example, the column range of pixels to be read in the region 22 is the second to the fifth columns, and the column range of the region 23 is the fourth to the fifth columns. In other words, $x_{01} \leq x_{02} \leq x_{22}$ is satisfied between the scan range of the region 22 and the scanning start position of the region 23 in this case (Steps 501, 502 and 504).

The instruction signal of the read region corresponding to the region 23 is generated by the control instructing unit 14 at the time $t_C$ (not shown), a read operation of the region 22 is executed until the last row of the next frame is reached, i.e., until the time $t_1$ in FIG. 7 (Step 701). A read operation of the region 22 is again started at the time $t_1$ (Step 702). At this time, a storing operation of the scanning start position is not executed. Next, the scanning start position of the region 23 is stored at the time $t_M$ (Step 703). By the operations described above, a read operation corresponding to the region 23 is executed after the time $t_2$ (Step 704). Thus, in Case b, the read operation of the region 22 serves as the storing operation of the scanning start position of the region 23.

Figure 8:
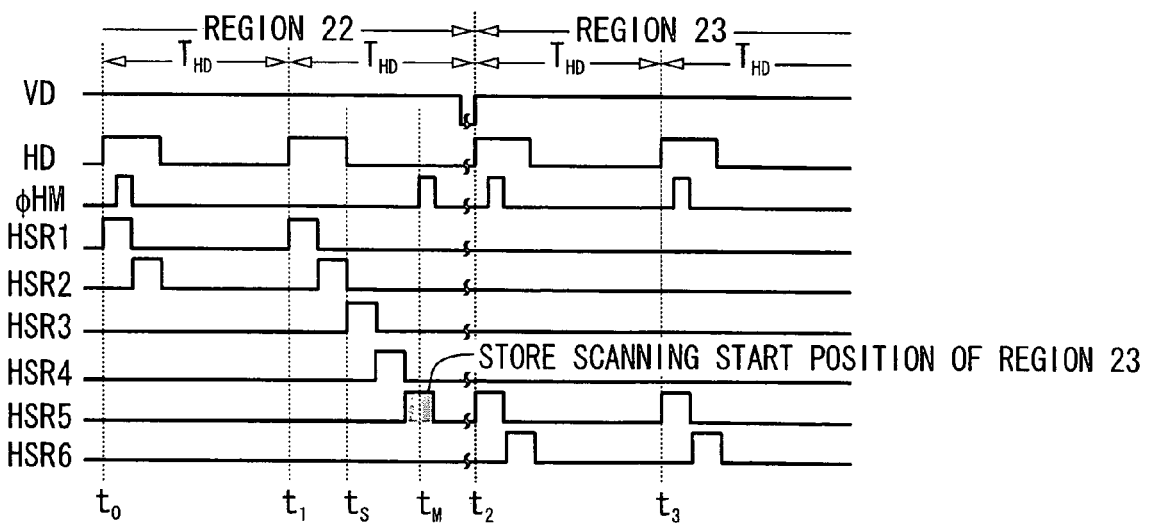
FIG. 8 is a timing chart of a horizontal scanning circuit according to this embodiment.
Figure 16:
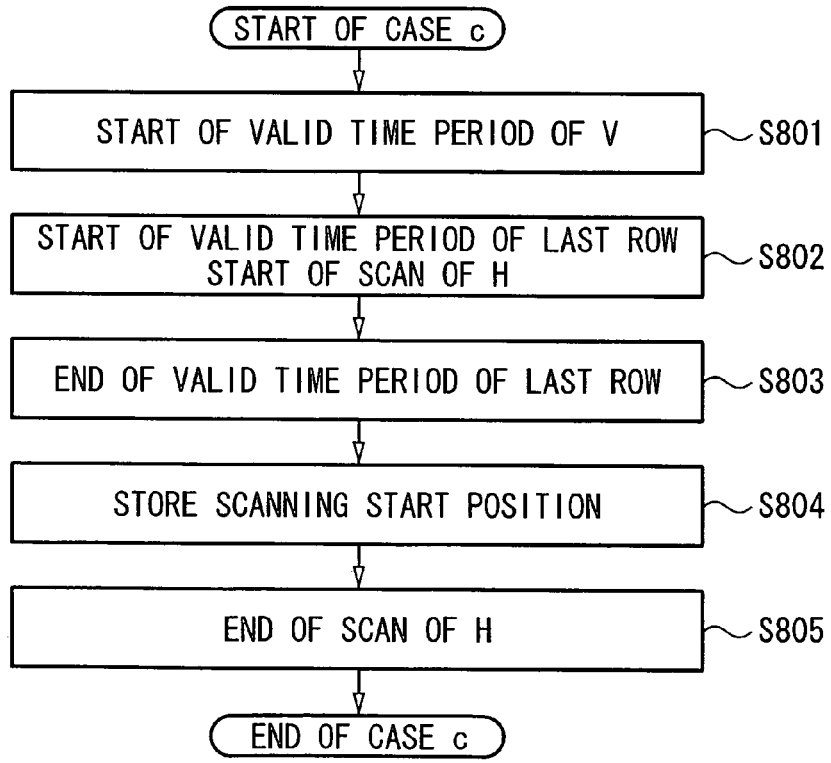
FIG. 16 is a flowchart of Case c in shown FIG. 13.

FIG. 8 is a timing chart for setting the scanning start position of the horizontal scanning circuit 12b when the read region is changed from the region 22 to the region 23, which corresponds to the above-described Case c. FIGS. 13 and 16 are flowcharts showing operational flows in such a case. In this case, for example, the column range of pixels to be read in the region 22 is the first to the second columns, and the column range of the region 23 is the fifth to the sixth columns. In other words, $x_{02} > x_{11}$ is satisfied between the scan range of the region 22 and the scanning start position of the region 23 in this case (Steps 501, 502 and 505).

The instruction signal of the read region corresponding to the region 23 is generated by the control instructing unit 14 at the time $t_C$ (not shown), a read operation of the region 22 is executed until the last row of the next frame is reached, i.e., until the time $t_1$ in FIG. 8 (Step 801). A read operation of the region 22 is again started at the time $t_1$ (Step 802). At this time, a storing operation of the scanning start position is not executed. After the read operation of the region 22 is completed, an operation on the shift registers of the horizontal scanning circuit 12b is continued from the time $t_S$ (step 803). Then, the scanning start position of the region 23 is stored at the time $t_M$ (Step 804). By the operations described above, a read operation corresponding to the region 23 is executed after the time $t_2$ (Step 805). Thus, in Case c, a part of the read operation of the region 22 serves as the storing operation of the scanning start position of the region 23.

As described above, the solid state imaging apparatus having the structure shown in FIG. 1 is configured to compare a scanning start position of the scan range of the region for the current read operation, and that of a newly selected region, and to switch the patterns of timing to set the scanning start position according to the result of the comparison. Thus, even when the read region is changed while a read operation is being executed by the solid-state image sensing device 12, picture signals can be output without causing any disruption.

Furthermore, in the above description, although the structures of the horizontal scanning circuit 12b and the vertical scanning circuit 12c that constitutes the solid-state image sensing device 12 have been explained with reference to FIG. 1, the structures are not particularly limited to this embodiment provided that the same operations and effects are achieved. Furthermore, in the above description, while a method for canceling scan is not described, shift registers having a clear function may be used and an example of such shift registers are disclosed in Japanese Unexamined Patent Application, First Publication No. H06-338198.

Furthermore, in FIGS. 3, 5, 6, and 8, it is possible to shorten during the pre-scanning step by executing scanning during horizontal and vertical blanking faster than the actual scanning.

While preferred embodiments of the invention have been described and illustrated above, it should be understood that these are examples of the invention and are not to be considered as limiting, and modification without departing from the spirit or scope of the present invention is possible. For example, in the above-described embodiment, one of the cases is selected by comparing the scanning start positions before and after the change, it is possible to select by comparing the regions before and after the change.

What is claimed is:

1. A solid state imaging apparatus comprising:
    an imaging area comprising a plurality of pixels that are organized into a two-dimensional plane;
    a scanning circuit that reads a signal of the pixels from the pixels of a read region that is set in at least one of a horizontal direction and a vertical direction in the imaging area; and
    a control unit that changes patterns of timing of the scanning circuit according to the result of a comparison of a first read region which has already been set in the scanning circuit and a second read region which is going to be newly set in the scanning circuit.

2. The solid state imaging apparatus according to claim 1, wherein the scanning circuit comprises:
    a shift register comprising a plurality of shift register units, each of the shift register units defining a stage, each of the shift register units conveying information that is input, to a shift register unit of a next stage in response to a clock;
    a storage portion that stores information stored in the shift register;
    a first transfer unit that transfers information stored in the shift register to the storage portion; and
    a second transfer unit that transfers information stored in the storage portion to the shift register.

3. The solid state imaging apparatus according to claim 2, wherein the control unit executes:
    the pre-scanning that is executed on the second read region which is going to be newly set prior to the actual scanning for reading a signal from the imaging area, causes the first transfer unit to store information that has been transferred to the shift register into the storage portion corresponding to the read region and
    the actual scanning causes the second transfer unit to store information that has been stored in the storage portion during the pre-scanning to the shift register unit.

4. The solid state imaging apparatus according to claim 3, wherein the control unit controls to execute the pre-scanning after the actual scanning is completed when one end of the second read region which is going to be newly set is positioned in front of the first read region which has already been set in a direction to execute the read operation.

5. The solid state imaging apparatus according to claim 3, wherein the control unit controls to execute the pre-scanning in the actual scanning when one end of the second read region which is going to be newly set is included in the first read region which has already been set.

6. The solid state imaging apparatus according to claim 3, wherein the control unit controls to execute the pre-scanning in the actual scanning by continuing the actual scanning when one end of the second read region which is going to be newly set is positioned behind the first read region which has already been set.

7. The solid state imaging apparatus according to claim 1, wherein the control unit changes a setting of the scanning circuit to the second read region which is going to be newly set in a scanning period when the first read region which has already been set in the scanning circuit is read.

8. The solid state imaging apparatus according to claim 7, wherein a reading operation of the first read region includes an operation to change a setting of a read region from the first read region to the second read region.

9. The solid state imaging apparatus according to claim 7, wherein a read operation of the first read region serves as a storing operation of a scanning start position of the second read region.

10. A solid state imaging apparatus comprising:
    an imaging area comprising a plurality of pixels that are organized into a two-dimensional plane;
    a scanning circuit that reads a signal of the pixels from the pixels of a read region that is set in at least one of a horizontal direction and a vertical direction in the imaging area; and
    a control unit that changes patterns of timing of the scanning circuit according to a second read region which is going to be newly set in a scanning period when a first read region which has already been set in the scanning circuit is read.

11. The solid state imaging apparatus according to claim 10, wherein the scanning circuit comprises:
    a shift register comprising a plurality of shift register units, each of the shift register units defining a stage, each of the shift register units conveying information that is input, to a shift register unit of a next stage in response to a clock;
    a storage portion that stores information stored in the shift register;
    a first transfer unit that transfers information stored in the shift register to the storage portion; and
    a second transfer unit that transfers information stored in the storage portion to the shift register.

12. The solid state imaging apparatus according to claim 11, wherein the control unit executes:
    the pre-scanning that is executed on the second read region which is going to be newly set prior to the actual scanning for reading a signal from the imaging area, causes the first transfer unit to store information that has been transferred to the shift register into the storage portion corresponding to the read region and
    the actual scanning causes the second transfer unit to store information that has been stored in the storage portion during the pre-scanning to the shift register unit.

13. The solid state imaging apparatus according to claim 12, wherein the control unit controls to execute the pre-scanning after the actual scanning is completed when one end of the second read region which is going to be newly set is positioned in front of the first read region which has already been set in a direction to execute the read operation.

14. The solid state imaging apparatus according to claim 12, wherein the control unit controls to execute the pre-scanning in the actual scanning when one end of the second read region which is going to be newly set is included in the first read region which has already been set.

15. The solid state imaging apparatus according to claim 12, wherein the control unit controls to execute the pre-scanning in the actual scanning by continuing the actual scanning when one end of the second read region which is going to be newly set is positioned behind the first read region which has already been set.

16. The solid state imaging apparatus according to claim 10, wherein a reading operation of the first read region includes an operation to change a setting of a read region from the first read region to the second read region.

17. The solid state imaging apparatus according to claim 10, wherein a read operation of the first read region serves as a storing operation of a scanning start position of the second read region.

* * * * *